US006930395B2

(12) United States Patent
Tomekawa et al.

(10) Patent No.: US 6,930,395 B2
(45) Date of Patent: Aug. 16, 2005

(54) CIRCUIT SUBSTRATE HAVING IMPROVED CONNECTION RELIABILITY AND A METHOD FOR MANUFACTURING THE SAME

(75) Inventors: Satoru Tomekawa, Osaka (JP); Yoshihisa Yamashita, Kyoto (JP); Takeshi Suzuki, Osaka (JP); Yoshihiro Kawakita, Osaka (JP); Tadashi Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/998,327

(22) Filed: Dec. 3, 2001

(65) Prior Publication Data

US 2002/0066961 A1 Jun. 6, 2002

(30) Foreign Application Priority Data

Dec. 5, 2000 (JP) .......................... 2000-370406

(51) Int. Cl.⁷ .................. H01L 23/48; H01L 23/52; H01L 29/40
(52) U.S. Cl. .................. 257/773; 257/775; 428/98; 174/68.1
(58) Field of Search .................. 257/779–784, 257/773, 775; 428/98; 174/68.1

(56) References Cited

U.S. PATENT DOCUMENTS

| 4,863,683 A | * | 9/1989 | Nakatani et al. ............... 419/10 |
| 5,252,519 A | * | 10/1993 | Nakatani et al. ............... 437/209 |
| 5,286,926 A | * | 2/1994 | Kimura et al. ............... 174/250 |
| 5,459,368 A | * | 10/1995 | Onishi et al. ............... 310/313 R |
| 5,729,893 A | * | 3/1998 | Tanifuji et al. ............... 29/830 |
| 5,888,627 A |   | 3/1999 | Nakatani |
| 6,010,769 A | * | 1/2000 | Sasaoka et al. ............... 428/209 |
| 6,027,791 A | * | 2/2000 | Higashi et al. ............... 428/209 |
| 6,143,116 A | * | 11/2000 | Hayashi et al. ............... 156/233 |
| 6,329,610 B1 | * | 12/2001 | Takubo et al. ............... 174/264 |
| 2002/0005247 A1 | * | 1/2002 | Graham et al. ............... 156/291 |
| 2002/0046880 A1 | * | 4/2002 | Takubo et al. ............... 174/261 |

FOREIGN PATENT DOCUMENTS

| EP | 0 530 840 A1 | 3/1993 | |
| EP | 0 576 872 A1 | 1/1994 | |
| EP | 576872 A1 | 1/1994 | |
| EP | 0 651 602 A1 | 5/1995 | |
| EP | 0 961 533 A2 | 12/1999 | |
| JP | 407045950 A | * 2/1995 | ............ H05K/3/46 |
| JP | 2601128 | 1/1997 | |
| JP | 409036152 A | * 2/1997 | ............ H01L/21/56 |
| JP | 409321171 A | * 12/1997 | ............ H01L/23/12 |
| JP | 410107398 A | * 4/1998 | ............ H05K/1/18 |
| JP | 410135273 A | * 5/1998 | ............ H01L/21/60 |
| JP | 2000-68620 A | 3/2000 | |
| JP | 02001053112 A | * 2/2001 | ............ H01L/21/60 |

OTHER PUBLICATIONS

Chang et al., Internal Stress and Connection Resistance Correlation Study of Microbump Bonding, Sep. 2001, IEEE, vol. 24 No. 3, 493–499.*

* cited by examiner

Primary Examiner—Mary Wilczewski
Assistant Examiner—Monica Lewis
(74) Attorney, Agent, or Firm—McDermott Will & Emery LLP

(57) ABSTRACT

A connecting strength at a bonding site between a wiring layer $1c$ and a conductor $1d$ is enhanced by comparing a bonding strength between a wiring layer 14 provided by covering the conductor $1d$ on an insulating base $1a$ and the conductor $1d$ with a bonding strength between the wiring layer $1c$ and the insulating base $1a$ in an adjacency of the conductor to set the latter relatively lower.

10 Claims, 12 Drawing Sheets

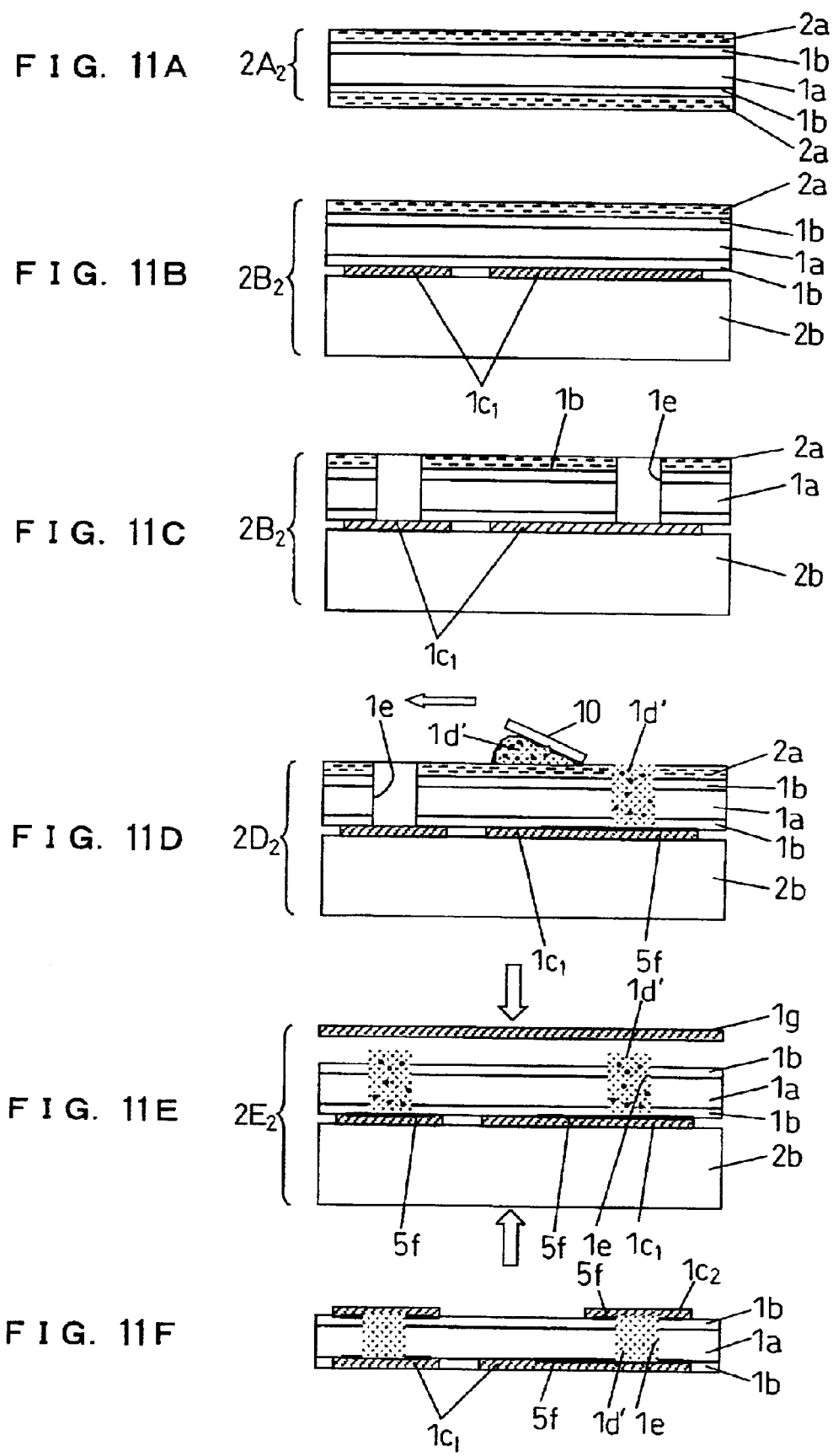

CIRCUIT SUBSTRATE HAVING IMPROVED CONNECTION RELIABILITY AND A METHOD FOR MANUFACTURING THE SAME

BACKGROUND OF THE INVENTION

1. Field of the Invention

The present invention relates to a circuit substrate and a manufacturing method thereof, and more specifically to a circuit substrate in which an interlayer connection is implemented via an interstitial via hole (hereafter referred to as IVH) and a manufacturing method thereof.

2. Description of the Related Art

In recent years, in accordance with the development of electronic devices with smaller scale and higher density, there is an increasing demand for a circuit substrate suitable for smaller scale and higher density not only for industrial use but also widely for public use. As an example of a circuit substrate devised to meet such a demand, there is one disclosed in Japanese Patent No. 2,601,128. This is a multi-layer circuit substrate consisting of IVH resin layers in which an interlayer connection is implemented via the IVH.

In this circuit substrate, wiring layers bonded on to respective surfaces of plural sheets of insulating base are in contact with a conductor such as a conductive powder filled in a through hole of the insulating base, so as to establish electrical conduction and connection between the wiring layers.

This circuit substrate is manufactured, for example, in the following manner. Upon forming a through hole in an insulating base having compressibility, this through hole is filled with a resin composition containing a conductive powder. Thereafter, upon laminating a conductor foil onto a surface of the insulating base, the insulating base and the conductor foil are heated while being compressed in a thickness direction. Subsequently, the conductor foil on the surface of the insulating base is etched to form a wiring layer, thereby completing a circuit substrate.

Generally, electronic components such as represented by semiconductors mounted on a circuit substrate generate heat at the time of use. For this reason, the circuit substrate receives a radiation heat caused by heat generation of these electronic components. Further, since this heat generation changes in accordance with conditions such as the period of time of use, the circuit substrate is used under a temperature cycle of rising and falling temperature. The thermal expansion of an insulating base is generally larger than the thermal expansion of a conductor in the IVH. On the other hand, in a multi-layer circuit substrate consisting of IVH resin layers, the bonding strength between the wiring layer and the insulating base in an adjacency of the IVH is equal to or higher than the bonding strength between the wiring layer and the thermosetting resin composition in the IVH.

In contrast, there is structurally a difference of thermal expansion coefficient between the insulating base and the conductor in the IVH. For this reason, it is inevitable that the stress caused by the difference of thermal expansion coefficient is generated in a thickness direction of the circuit substrate. However, if such a stress is generated, the stress is received by the whole wiring layer and, as a result, the stress in an adjacency of the IVH connection part cannot be alleviated in the wiring layer. For this reason, if the above-mentioned temperature cycle is repeated, it is difficult to ensure high connection reliability in a multi-layer circuit substrate.

SUMMARY OF THE INVENTION

Thus, a principal object of the present invention is to provide a circuit substrate that can ensure high connection reliability under the temperature cycle.

In order to achieve the above-mentioned object, the present invention lies in that the bonding strength between a wiring layer provided by covering the conductor on an insulating base and a conductor is compared with the bonding strength between the wiring layer and the insulating base in an adjacency of the conductor to set the latter relatively lower. This leads to the following results.

By setting a relative relationship of the above-mentioned bonding strength , when the stress caused by the difference of thermal expansion between the insulating base and the conductor is generated, the stress generates the following. Since the bonding strength between the wiring layer and the insulating base is weaker than the bonding strength between the conductor and the wiring layer, the interface between the insulating base and the wiring layer serves as a stress-alleviating part. For this reason, the stress is less likely to affect the bonding strength between the wiring layer and the conductor.

Thus, the stress is absorbed by the above-mentioned stress-alleviating action, and hence is less likely to affect the bonding site between the wiring layer and the conductor. This enhances the connecting strength at the bonding site between the wiring layer and the conductor, whereby the circuit substrate can exhibit a high connection reliability even under a temperature cycle that is close to normal state of use.

Here, the relative relationship of the above-mentioned bonding strength can be established by comparing the glass transition temperature of the resin composition constituting the conductor with the glass transition temperature of the resin composition constituting the surface site of the insulating face to set the latter higher.

Generally, regarding resins, those having a lower glass transition temperature have a smaller internal stress in the cured product, leading to a larger bonding force. For this reason, by providing this construction, the bonding strength between the conductor and the wiring layer can be made higher than the bonding strength between the wiring layer and the insulating base.

Similarly, if the insulating base and the conductor each contain a thermosetting epoxy resin composition, the relative relationship of the above-mentioned bonding strength can be established by comparing a volume content of the thermosetting epoxy resin in the conductor with a volume content of the thermosetting epoxy resin in the insulating base to set the latter lower.

Generally, epoxy resin is known to have a high bonding force among organic resins. For this reason, this construction can optimally set the relative relationship of the above-mentioned bonding strength.

Here, an important factor in maintaining the bonding strength between the wiring layer and the conductor is the bonding strength between the wiring layer and the insulating base in the adjacency of the conductor. For this reason, the above-mentioned action can be effectively exhibited by setting the bonding strength between the wiring layer and the insulating base in the adjacency of the conductor to be relatively lower than the bonding strength between the wiring layer and the conductor.

In this case, the relative relationship of the above-mentioned bonding strength can be established by forming a metal cohesion between the conductor and the wiring layer. This is because formation of metal cohesion enhances the bonding force thereof.

Similarly, the relative relationship of the above-mentioned bonding strength can be established by providing a non-bonded region at a part of a bonding site between the wiring layer and the insulating base in the adjacency of the conductor. This is because a site where a non-contact region has been formed has a lower bonding force.

Similarly, the relative relationship of the above-mentioned bonding strength can be established by providing a region containing an uncured resin component at a bonding site between the wiring layer and the insulating base in the adjacency of the conductor. This is because a site where a region containing an uncured resin component has been formed has a lower bonding force.

Similarly, the relative relationship of the above-mentioned bonding strength can be established by forming an irregularity at a bonding site between the conductor and the wiring layer. This is because the irregularity structure produces an anchoring effect, and the uneven structure facilitates generation of the above-mentioned metal cohesion.

Moreover, the bonding strength between the conductor and the insulating base on a wall surface of the conductor may be set to be relatively lower than the tensile strength of the conductor in the thickness direction of the insulating base. Therefore, when the stress caused by the difference of thermal expansion between the insulating base and the conductor is generated, the stress generates the following.

Since the bonding strength between the conductor and the insulating base on the wall surface of the conductor is weaker than the tensile strength of the conductor in the thickness direction of the insulating base, the interface between the conductor and the insulating base on the wall surface of the conductor serves as a stress-alleviating part, so that the stress is less likely to affect the bonding strength between the wiring layer and the conductor. For this reason, the stress is absorbed by the above-mentioned stress-alleviating action, and hence is less likely to affect the bonding site between the wiring layer and the conductor. This enhances the connecting strength at the bonding site between the wiring layer and the conductor, thereby having a high connection reliability even under a temperature cycle that is close to normal state of use.

BRIEF DESCRIPTION OF THE DRAWINGS

These and other objects of the present invention will become more apparent from the following detailed description of embodiments and will be precisely indicated in the appended claims. Further, those skilled in the art will be reminded of numerous advantages that are not touched upon in this specification by carrying out the present invention with reference to the accompanying drawings, in which:

FIGS. 11A to 11F are cross-sectional views respectively showing a first manufacturing method of a both-sided circuit substrate according to fifth embodiment of the present invention;

DETAILED DESCRIPTION OF THE INVENTION

Hereafter, preferred embodiments of the present invention will be described in detail with reference to the attached drawings. In these embodiments, the present invention is carried out by raising a both-sided circuit substrate or a multi-layer circuit substrate (with four layers in this example) as an example, however, it goes without saying that the present invention is not limited to these embodiments.

Figure 1:
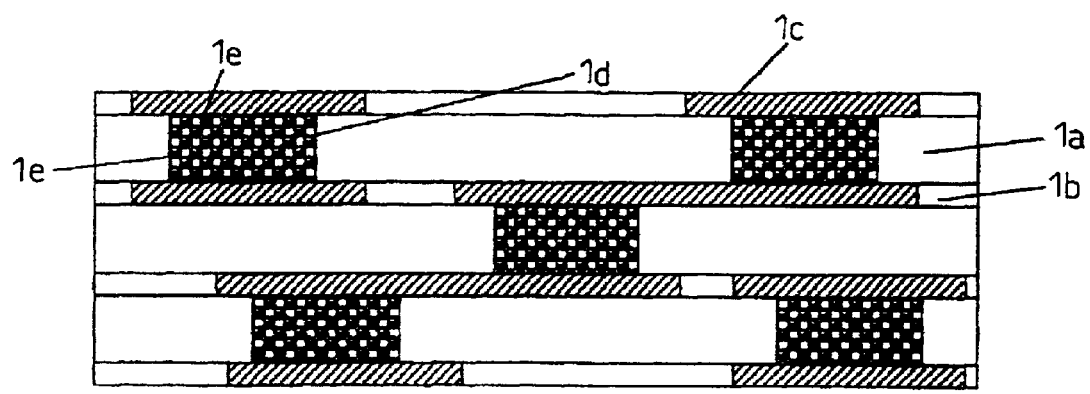
FIG. 1 is a cross-sectional view showing a circuit substrate according to first, second and seventh embodiments of the present invention.

First, a basic construction of a multi-layer circuit substrate commonly used in each embodiment of the present invention will be described. FIG. 1 is a cross-sectional view showing a multi-layer circuit substrate applied to each embodiment. This multi-layer circuit substrate includes an insulating base 1a having a through hole 1e in a thickness direction, a resin bonding layer 1b provided on both surfaces of the insulating base 1a, and a conductive paste 1d buried in the through hole 1e. Wiring layers 1c provided on respective both surfaces of the insulating base 1a laminated and located in three layers are electrically connected via the conductive paste 1d to form a multi-layer circuit substrate made of a sum of four layers.

As a material for the insulating base 1a, a film mainly made of an organic material can be used. An example of the organic material film includes, for example, a polyimide film, an aramid film, a liquid crystal polymer film, or the like. An example of the resin bonding layer provided on both surfaces of the insulating base 1a may be include, for example, an epoxy series adhesive or an imide series adhesive.

Here, by using a compressible insulating base having adhesiveness as the insulating base 1a, the resin bonding layer 1b can be omitted. A preferable example of such a compressible insulating base may include, for example, a prepreg. The prepreg constitutes an insulating base having numerous void holes dispersed therein when the prepreg is brought into a semi-cured state by impregnating a base with a thermosetting resin. The prepreg exhibits compressibility by this constitution.

A preferable example of the base used in the prepreg may be include, for example, a base of aromatic polyamide fiber, a glass cloth base, a glass non-woven cloth base, an aramid cloth base, an aramid non-woven cloth base, a liquid crystal polymer non-woven cloth base, or the like. Moreover, a preferable example of the thermosetting resin used for impregnating the base may be include a known thermosetting resin such as a phenol series resin, a naphthalene series resin, a urea resin, an amino resin, an alkyd resin, a silicone resin, a furan resin, an unsaturated polyester resin, an epoxy resin, a polyurethane resin, or the like, and further include a combination of one or more resin(s) optionally selected from these. However, if such an insulating base (prepreg) is used, the conductive paste is not compressed by burial of the wiring layer into the insulating base but by compressibility of the insulating base.

The wiring layer $1c$ may be include, for example, a copper foil patterned by the etching method or the like, or a copper foil made in the above-mentioned manner and plated with a metal such as copper.

The conductive paste $1d$ may be include, for example, a composite material made of a conductive powder and a thermosetting resin. The conductive powder constituting the conductive paste $1d$ may be include, for example, at least one kind of powder or a combination of plural kinds of powders selected from gold, silver, copper, nickel, lead, tin, an alloy thereof, and such a metal plated with another metal.

The thermosetting resin constituting the conductive paste $1d$ may be include, for example, a known thermosetting resin such as a phenol series resin, a naphthalene resin, a urea resin, an amino resin, an alkyd resin, a silicone resin, a furan resin, an unsaturated polyester resin, an epoxy resin, a polyurethane resin, or the like, and these can be suitably combined for use.

The above is a basic construction of this multi-layer circuit substrate.

Next, a manufacturing method of a both-sided circuit substrate (a wiring layer is formed on both surfaces of a single-layer insulating base $1a$) forming a base in manufacturing a multi-layer circuit substrate will be described. FIGS. 2 and 3 are cross-sectional views showing steps in manufacturing the both-sided circuit substrate.

Figure 2A:
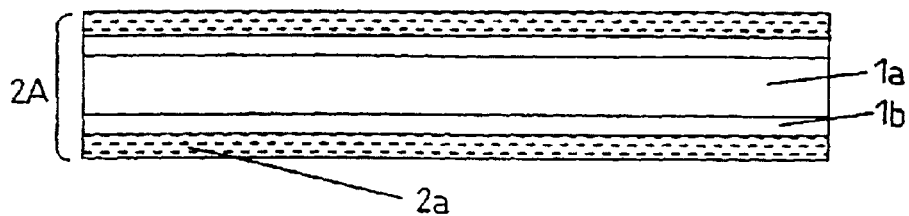
FIGS. 2A to 2D are cross-sectional views respectively showing a first step period in a manufacturing method of a circuit substrate according to the present invention.

First, as shown in FIG. 2A, a releasing film $2a$ made of polyester or the like is laminated on both surfaces of the insulating base $1a$ having a semi-cured resin bonding layer $1b$ provided on both surfaces thereof.

Figure 2B:
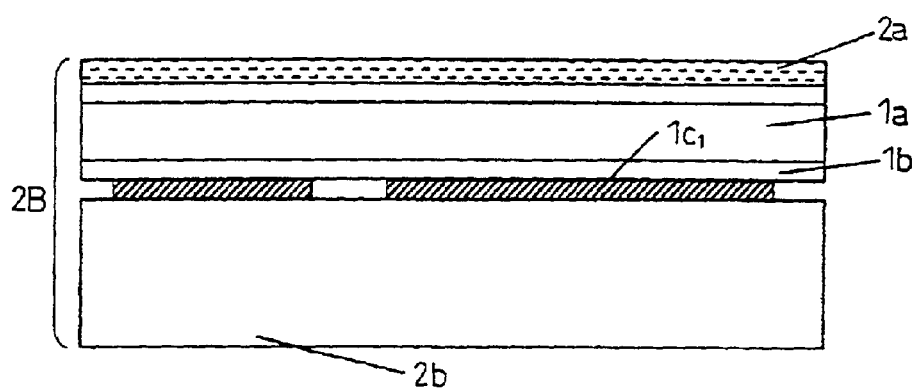

Next, as shown in FIG. 2B, a first wiring layer $1c_1$ is formed on a first supporting base $2b$ in advance. After that, the following process is carried out on the laminate 2A fabricated through the step of FIG. 2A. The releasing film $2a$ on one surface side of the insulating base $1a$ is released, and this insulating base $1a$ is laminated onto the first wiring layer $1c_1$ on the first supporting base $2b$. In this process, the insulating base $1a$ is placed so that one surface of the insulating base $1a$ from which the releasing film $2a$ has been released may abut on the first wiring layer $1c_1$. Here, the first wiring layer $1c_1$ constitutes one of the above-mentioned wiring layers $1c$.

Figure 2C:
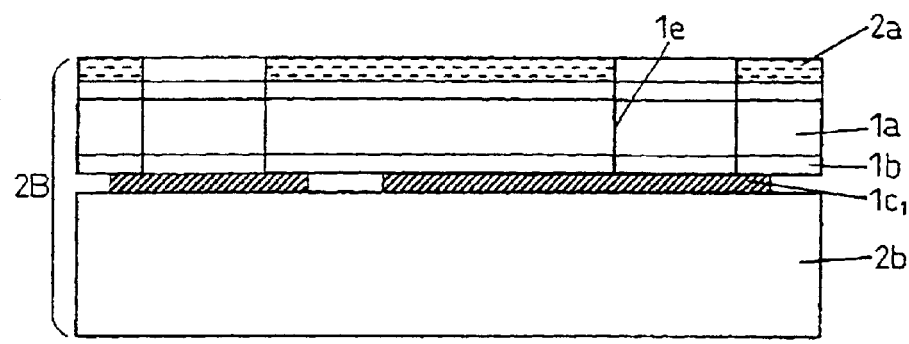

Next, in the laminate 2B fabricated through the step of FIG. 2B, a through hole $1e_1$ is formed at respective predetermined positions using a technique such as the laser processing method, as shown in FIG. 2C. The through hole $1e_1$ is formed from the remaining releasing film $2a$ side towards the insulating base $1a$ until the through hole $1e_1$ reaches the surface of the first wiring layer $1c_1$. Further, the through hole $1e_1$ is formed in alignment with the first wiring layer $1c_1$. Here, the through hole $1e_1$ constitutes one of the above-mentioned through hole $1e$.

Figure 2D:
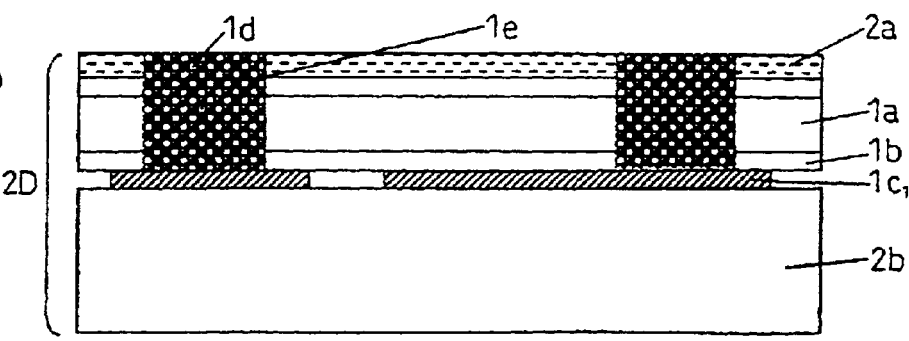

Subsequently, as shown in FIG. 2D, the through hole $1e_1$ is filled with a conductive paste $1d$ with the use of a squeegee or the like.

Figure 3A:
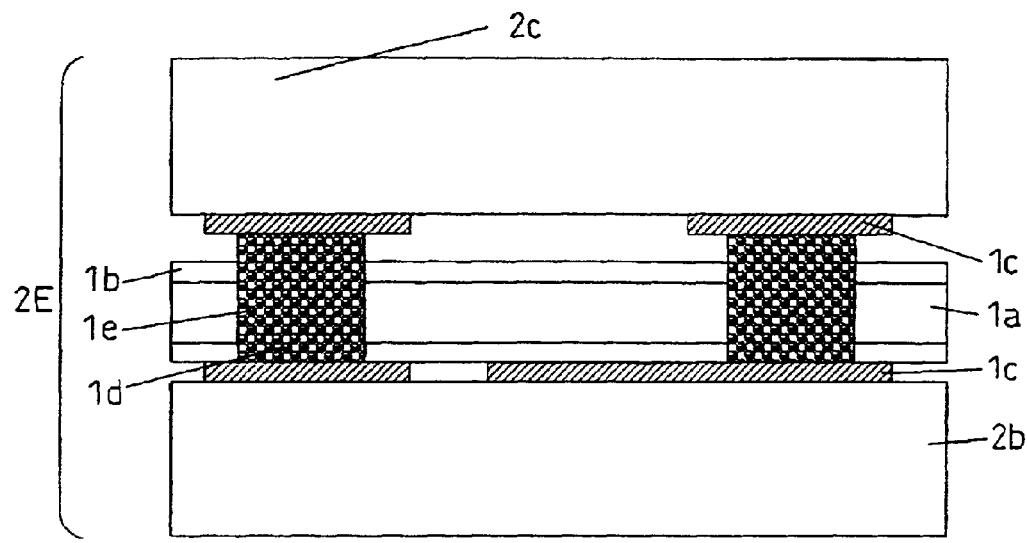
FIGS. 3A to 3C are cross-sectional views respectively showing a second step period in a manufacturing method of a circuit substrate according to the present invention.

Next, as shown in FIG. 3A, the remaining releasing film $2a$ is released and removed from the laminate 2D fabricated through the step of FIG. 2D. In the meantime, a copper foil is prepared in advance, or a second supporting base $2c$ having a second wiring layer $1c_2$ formed thereon is prepared. Here, the second wiring layer $1c_2$ constitutes one of the above-mentioned wiring layers $1c$.

In the step shown in FIG. 3A, the second wiring layer $1c_2$ formed on the second supporting base $2c$ is used. For this reason, the following description will be given assuming that the second wiring layer $1c_2$ formed on the second supporting base $2c$ is to be used.

The second wiring layer $1c_2$ on the second supporting base $2c$ is laminated and placed onto the insulating base $1a$. In this process, the both layers are aligned with each other so that the second wiring layer $1c_2$ and the conductive paste $1d$ may meet with each other at a predetermined position.

Figure 3B:
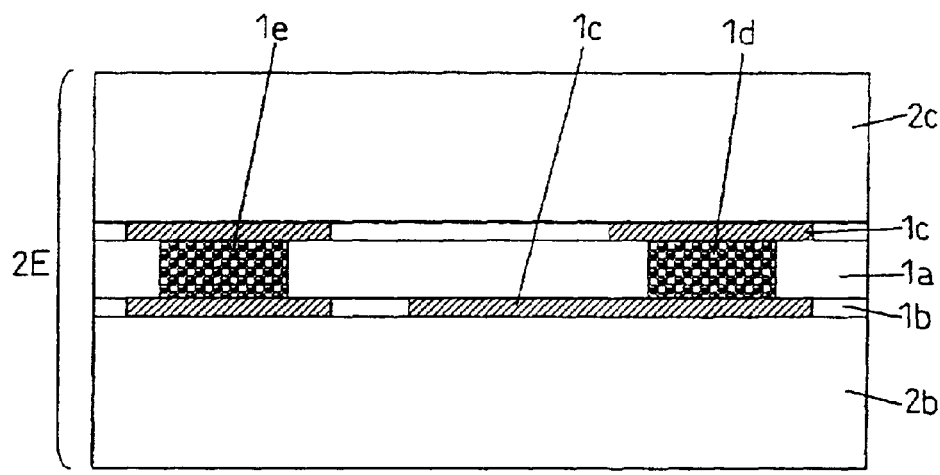
Figure 3C:
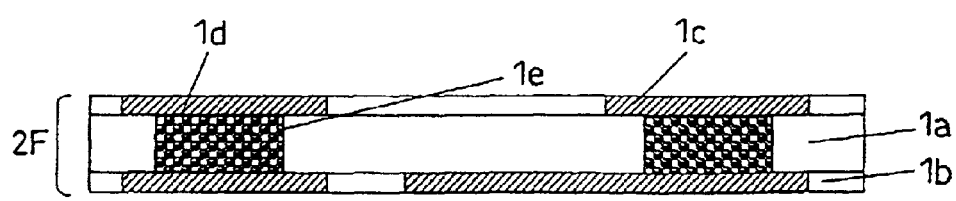

Next, the laminate 2E fabricated through the step of FIG. 3A is heated while being compressed in the thickness direction of the insulating base $1a$, as shown in FIG. 3B. Thereafter, as shown in FIG. 3C, the first and second supporting bases $2b$, $2c$ are removed from the laminate 2E to complete the both-sided circuit substrate 2F.

Here, in the case of laminating a copper foil, after the laminate 2E is heated and pressurized, the copper foil is subjected to a patterning process by the etching method or the like to form a second wiring layer $1c_2$, and then the first supporting base $2b$ may be removed.

The manufacturing method described above is a method of manufacturing a both-sided circuit substrate. By repeating such a manufacturing method for plural times, a multi-layer circuit substrate can be manufactured. As an example of such a manufacturing of a multi-layer circuit substrate, a manufacturing method of a multi-layer circuit substrate referred to as a three-layer circuit substrate will be described with reference to FIGS. 4 to 6.

Figure 4A:
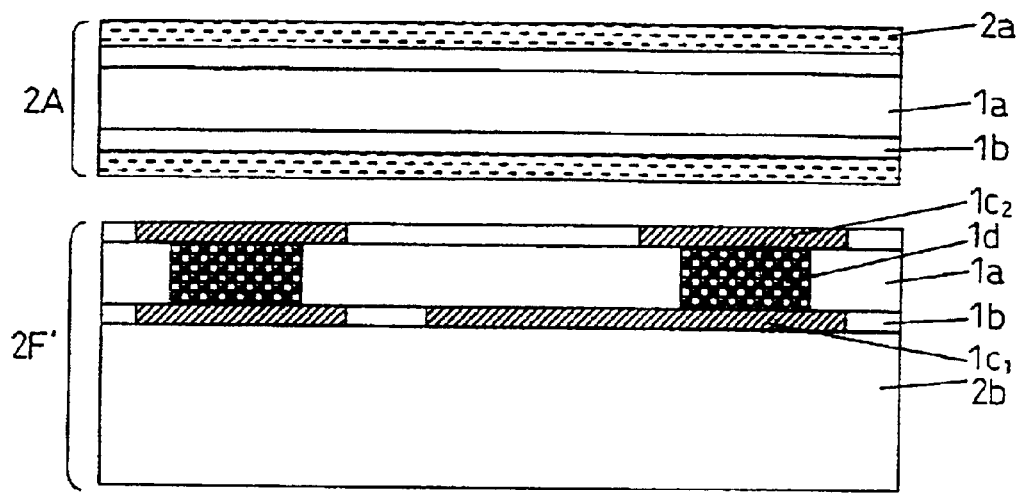
FIGS. 4A to 4C are cross-sectional views respectively showing a third step period in a manufacturing method of a circuit substrate according to the present invention.

First, as shown in FIG. 4A, a laminate 2A fabricated through the step of FIG. 2A and a both-sided circuit substrate 2F' fabricated through the step of FIG. 3 are prepared. However, the both-sided circuit substrate 2F' used here is one in a state in which one of the first and second supporting bases $2b$, $2c$ (first supporting base $2b$ in FIG. 4A) remains.

Figure 4B:
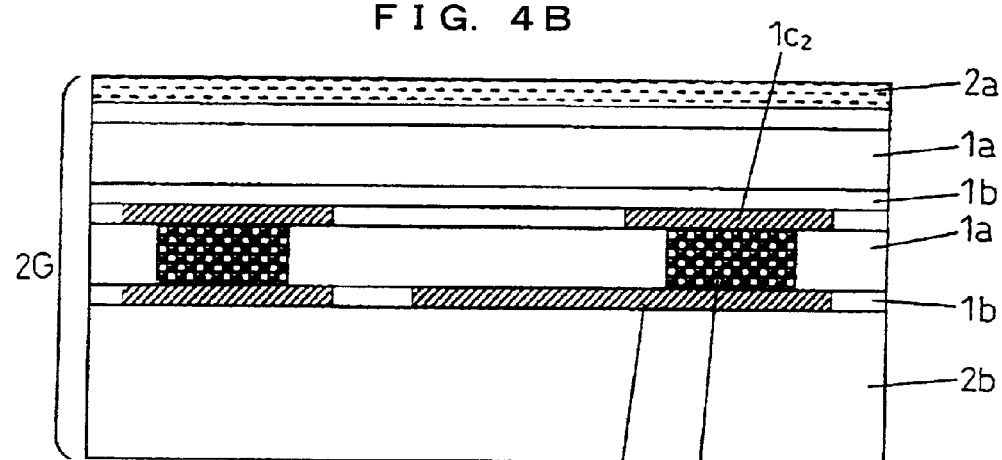

Next, as shown in FIG. 4B, upon releasing one releasing film $2a$ of laminate 2A, this laminate 2A is laminated onto the both-sided circuit substrate 2F'. In this process, the both layers are allowed to face each other so that the surface of the both-sided circuit substrate 2F' from which the releasing film has been removed may abut against the surface of the two-sided circuit substrate 2F' from which the supporting base has been removed.

Figure 4C:
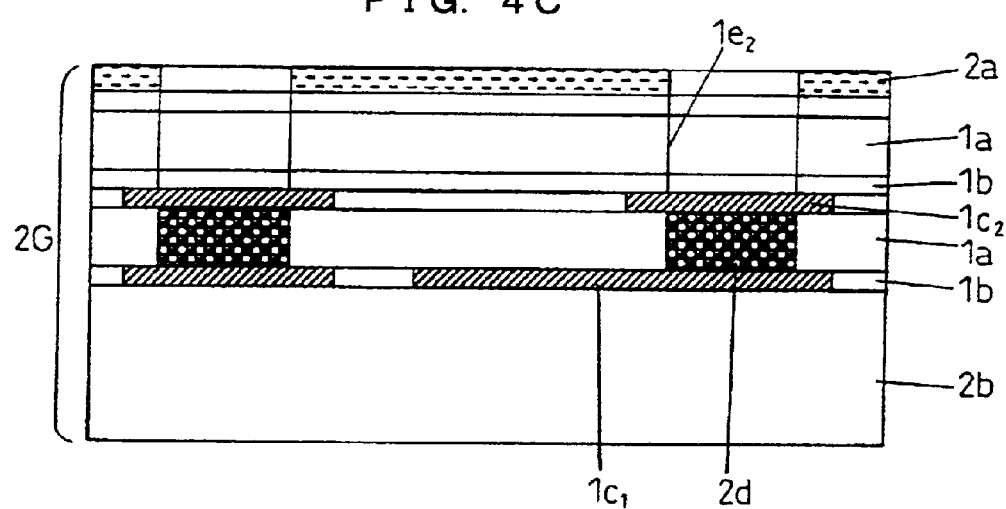

Next, in the laminate 2G fabricated through the step of FIG. 4B, a through hole $1e_2$ is formed at predetermined positions using a technique such as the laser processing method, as shown in FIG. 4C. The through hole $1e_2$ is formed from the remaining releasing film $2a$ side towards the insulating base $1a$ until the through hole $1e_2$ reaches the surface of the second wiring layer $1c_2$. Here, the through hole $1e_2$ constitutes one of the above-mentioned through hole $1e$.

Figure 5A:
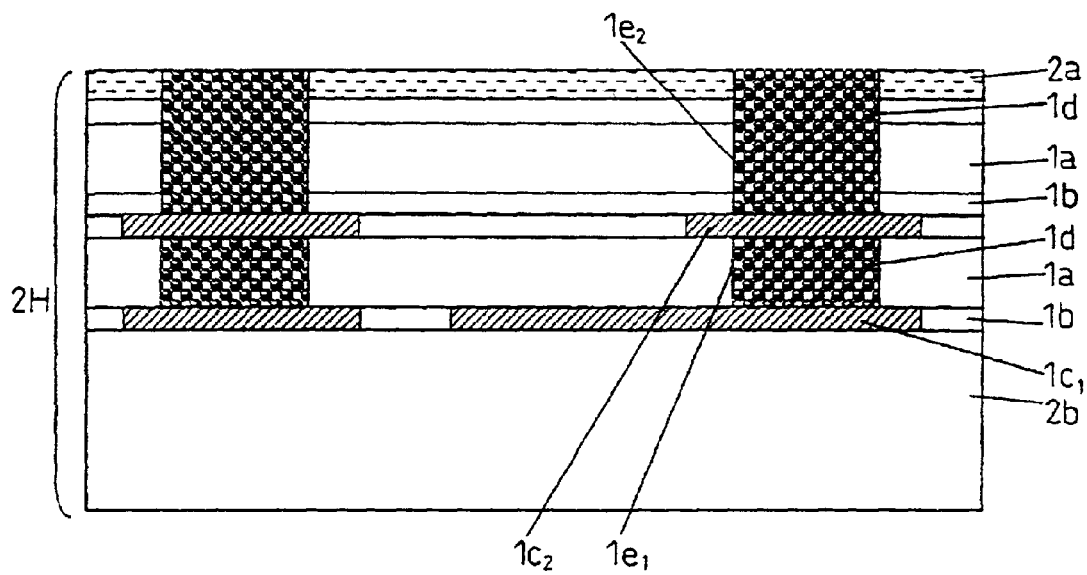
FIGS. 5A and 5B are cross-sectional views respectively showing a fourth step period in a manufacturing method of a circuit substrate according to the present invention.

Subsequently, as shown in FIG. 5A, the through hole $1e$ is filled with a conductive paste $1d$ with the use of a squeegee or the like.

Figure 5B:
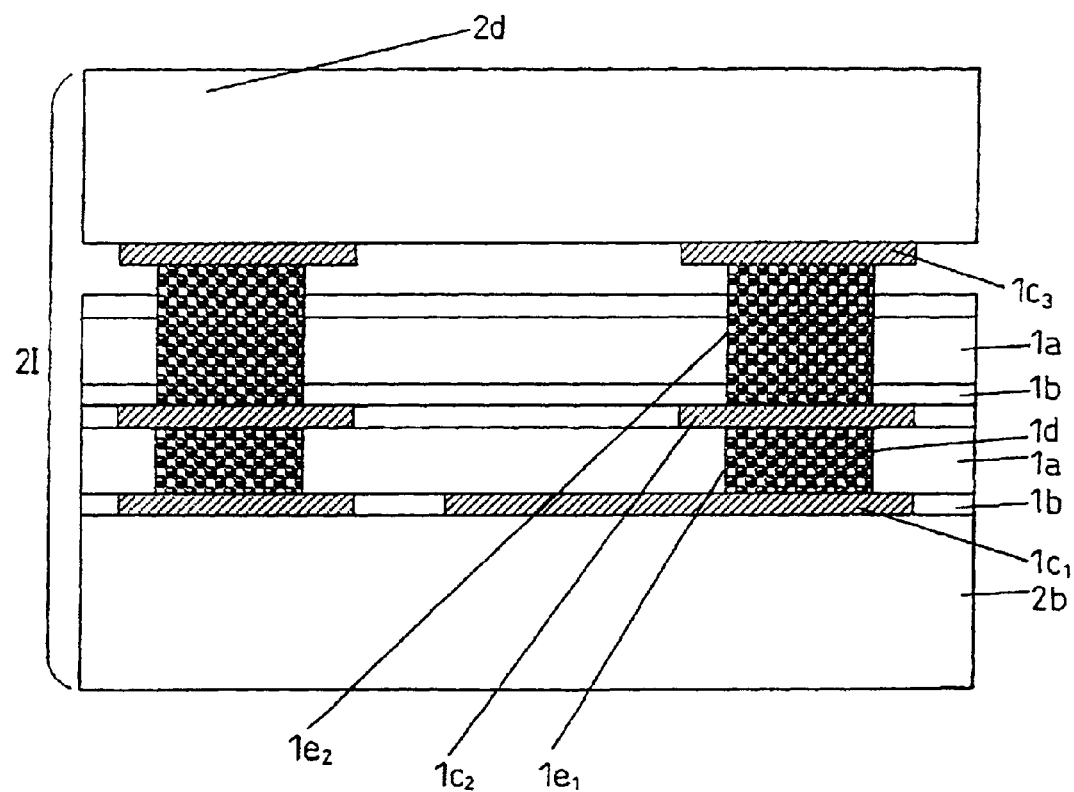

Next, as shown in FIG. 5B, the remaining releasing film $2a$ is removed from the laminate 2H fabricated through the step of FIG. 5A. In the meantime, a copper foil is prepared in advance, or a third supporting base $2d$ having a third wiring layer $1c_3$ formed thereon is prepared. Here, the third wiring layer $1c_3$ constitutes one of the above-mentioned wiring layers $1c$.

In the step shown in FIG. 5B, the third wiring layer $1c_3$ formed on the third supporting base $2d$ is used. For this reason, the following description will be given assuming that the third wiring layer $1c_3$ formed on the third supporting base $2d$ is to be used.

The third wiring layer $1c_3$ on the third supporting base $2d$ is laminated and placed on the insulating base $1a$. In this process, the both layers are aligned with each other so that the third wiring layer $1c_3$ and the conductive paste $1d$ may meet with each other at a predetermined position.

Figure 6A:
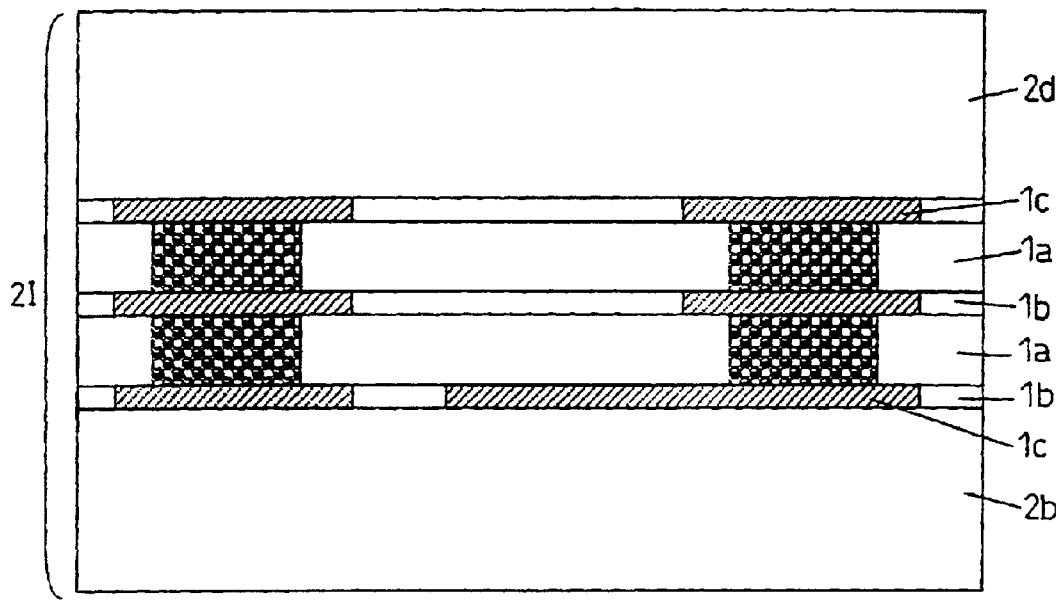
FIGS. 6A and 6B are cross-sectional views respectively showing a fifth step period in a manufacturing method of a circuit substrate according to the present invention.
Figure 6B:
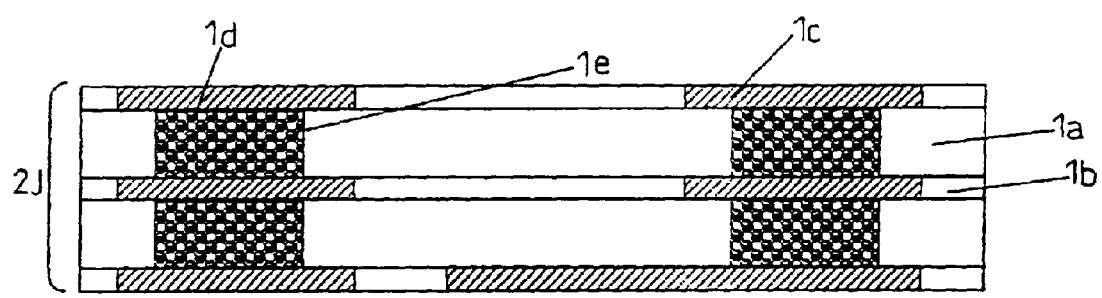

Next, a laminate 2I fabricated through the step of FIG. 5B is heated while being compressed in the thickness direction of the insulating base $1a$, as shown in FIG. 6A. Thereafter, as shown in FIG. 6B, the first and third supporting bases $2b$, $2d$ are removed from the laminate 2I to complete a three-layer circuit substrate 2J.

Here, in the case of laminating a copper foil, after the laminate 2I is heated and pressurized, the copper foil may be patterned by the etching method or the like to form the third wiring layer $1c_3$, and then the first supporting base $2b$ may be removed.

The circuit substrate of the present invention is fabricated in the manner shown above. Next, respective embodiments of the present invention will be described in detail.

First Embodiment

In this embodiment, an epoxy resin series adhesive having a glass transition temperature of 200° C. is prepared as the resin adhesive layer $1b$ to be formed on the insulating base $1a$. Further, a cured product which is made from a conductive powder and an epoxy resin and which has a glass transition temperature of 180° C. is prepared as the conductive paste $1d$.

This embodiment is characterized in that the glass transition temperature of the conductive adhesive layer $1b$ is set to be higher than the glass transition temperature of the resin component of the conductive paste $1d$. Here, since the basic construction of this multi-layer circuit substrate is similar to the multi-layer circuit substrate described with reference to FIG. 1, the description thereof will be omitted.

As a comparative example to this embodiment, the following is prepared. Namely, upon using the same conductive paste $1d$ (glass transition temperature of the resin component: 180° C.) as in this embodiment, a conductive adhesive layer $1b'$ having a lower glass transition temperature than this conductive paste $1d$ is prepared (glass transition temperature: 150° C.).

The comparative example is characterized in that the glass transition temperature of the conductive adhesive layer $1b$ is set to be lower than the glass transition temperature of the resin component of the conductive paste $1d$.

With the use of these materials, both-sided circuit substrates are respectively produced by the manufacturing method shown in FIGS. 2 and 3 in this embodiment and in the comparative example. Then, the product A of this embodiment and the product B of the comparative example are subjected to the following thermal shock test to compare the resistance at the via part before and after the test.

First, one hundred vias are selected from the vias (constructed with the conductive paste $1d$ in the through hole $1e$) formed inside the product A of this embodiment and in the product B of the comparative example. Upon this, these vias are subjected to a thermal shock test involving 50 cycles of repetition to hold these vias alternately in the temperature environments of −55° C. and 125° C. each for 30 minutes. Then, those in which the resistance of the via part has increased to be twice the resistance of the via part before the test are determined as defective ones, and the numbers thereof are compared.

As a result of the above test, the number of deficient ones was 20 in the product B of the comparative example, while the number of deficient ones was 2 in the product A of this embodiment. Thus, the product A of this embodiment shows an outstandingly good test result as compared with the product B of the comparative example.

Thus, by adopting the construction of this embodiment, the bonding strength between the conductive paste $1d$ and the wiring layer $1c$ is made higher than the bonding strength between the wiring layer $1c$ and the insulating base $1a$ and, as a result, the circuit substrate can have a high connection reliability even under a temperature cycle close to the normal state of use.

Hereafter, the reasons thereof will be described. Generally, regarding resins, those having a lower glass transition temperature has a smaller internal stress in the cured product, leading to a larger bonding force. For this reason, by providing the above-mentioned construction (the construction in which the glass transition temperature of the conductive adhesive layer $1b$ is higher than the glass transition temperature of the resin component of the conductive paste $1d$), the bonding strength between the wiring layer $1c$ and the insulating base $1a$ is made lower than the bonding strength between the conductive paste $1d$ and the wiring layer $1c$.

When a stress caused by the difference of thermal expansion between the insulating base $1a$ and the conductive paste $1d$ is generated in a state in which such a relative relationship of the bonding strength is established, the stress causes the interface between the wiring layer $1c$ and the insulating base $1a$ to serve as a stress-alleviating part. For this reason, the stress is absorbed by such a stress-alleviating action effected by the stress-alleviating part, and hence is less likely to affect the bonding site between the wiring layer $1c$ and the conductive paste $1d$. This enhances the connecting strength at the bonding site between the wiring layer $1c$ and the conductive paste $1d$.

Second Embodiment

In this embodiment, upon using a cured product made from a conductive powder and an epoxy resin as the conductive paste $1d$, a mixture of an imide series adhesive with an epoxy series adhesive is used as the resin adhesive layer $1b$.

Thus, this embodiment is characterized in that the content of the epoxy series adhesive in the resin adhesive layer $1b$ is made lower than the content of the epoxy series adhesive in the conductive paste $1d$. Here, since the basic construction of this both-sided circuit substrate is similar to the both-sided circuit substrate described with reference to FIGS. 2 and 3, the description thereof will be omitted.

As a comparative example according to this embodiment, the following is prepared. Namely, upon using a cured product made from a conductive powder and an epoxy resin as the conductive paste $1d$, a mixture with an epoxy series adhesive is used as the resin adhesive layer $1b$. Further, in the comparative example, the content of the epoxy series adhesive in the resin adhesive layer $1b$ is made equal to the content of the epoxy series adhesive in the conductive paste $1d$.

Further, with the use of these materials, both-sided circuit substrates are respectively fabricated by the manufacturing method shown in FIGS. 2 and 3 in this embodiment and in the comparative example. Then, the product C of this embodiment and the product D of the comparative example are subjected to a thermal shock test similar to the one described in embodiment 1 to compare the resistance at the via part before and after the test. As a result of the above test, the number of deficient ones was 40 in the product D of the comparative example, while the number of deficient ones was 4 in the product C of this embodiment. Thus, the product C of this embodiment showed an outstandingly good test result as compared with the product D of the comparative example.

Hereafter, the reasons thereof will be described. Generally, epoxy resin is known to have a high bonding force among organic resins. Therefore, by adopting the construction of this embodiment (the content of the epoxy series adhesive in the resin adhesive layer $1b$ is made lower than the content of the epoxy series adhesive in the conductive paste $1d$), the bonding strength between the wiring layer $1c$ and the insulating base $1a$ is made lower than the bonding strength between the conductive paste $1d$ and the wiring layer $1c$, in the same manner as in the above-described first embodiment. As a result of this, the circuit substrate can have a high connection reliability even under a temperature cycle close to the normal state of use.

Third Embodiment

Figure 7:
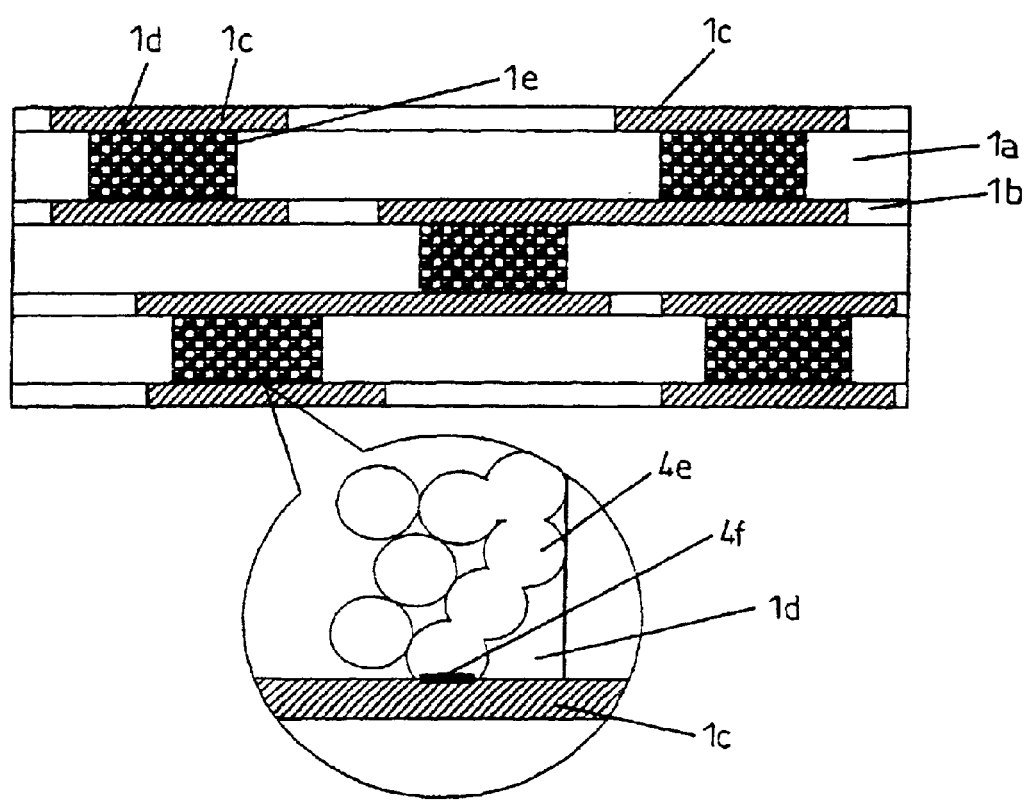
FIG. 7 is a cross-sectional view showing a multi-layer circuit substrate according to third embodiment of the present invention.

FIG. 7 is a cross-sectional view showing a multi-layer circuit substrate (made of four layers in FIG. 7) according to third embodiment of the present invention. Here, since the basic construction of this multi-layer circuit substrate is similar to the multi-layer circuit substrate described with reference to FIG. 1, the description thereof will be omitted.

In this embodiment, in such a multi-layer circuit substrate, the conductive powder $4e$ constituting the conductive paste $1d$ and the wiring layer $1c$ assume the following construction at the contact interface thereof. Namely, a metal cohesion $4f$ is formed at least at one of the connection points between the conductive powder $4e$ and the wiring layer $1c$.

When metal cohesion $4f$ is formed, the bonding strength at the bonding site thereof is enhanced. For this reason, the following relationship is generated when the bonding strength at the bonding site (where metal cohesion $4f$ is formed) between the wiring layer $1c$ and the conductive paste $1d$ is compared with the connecting strength at the bonding site (where metal cohesion $4f$ is not formed) between the wiring layer $1c$ and the insulating base $1a$.

Since the bonding strength at the bonding site between the wiring layer $1c$ and the conductive paste $1d$ is enhanced, the connecting strength between the wiring layer $1c$ and the insulating base $1a$ becomes relatively weaker than the bonding strength between the wiring layer $1c$ and the conductive paste $1d$.

As a result of the generation of such a relative relationship bonding strength, the reliability of electrical connection at the via part is enhanced in this embodiment in the same manner as in the above-described first and second embodiments.

Such a metal cohesion $4f$ can be produced, for example, in the following manner by applying the method of producing a multi-layer circuit substrate described above with reference to FIGS. 2 to 6.

A polyimide film having a thickness of 13 $\mu$m is used as the insulating base $1a$. Further, a resin adhesive layer $1b$ made of an imide series adhesive is formed to have a thickness of 5 $\mu$m as the adhesive layer $1b$. A copper foil pattern having a thickness of 9 $\mu$m is used as the wiring layer $1c$. With the use of these materials, a multi-layer circuit substrate is made on the basis of the production method described with reference to FIGS. 2 to 6. In this process, the pressing condition in the steps of FIGS. 3B and 6A is set to be 200° C. and 150 kg/cm².

In the above-mentioned manner, the circuit substrate in this embodiment can be manufactured; however, in manufacturing the circuit substrate of this embodiment, the following inconvenience may possibly occur.

Conductor foils such as copper foil to be used as the wiring layer $1c$ (first to third wiring layers $1c_1$ to $1c_3$) are not particularly limited. Generally, however, in the method of producing a circuit substrate, those having an antioxidant layer on the surface thereof are suitably used for facilitating the handling during the production process. An example of the antioxidant layer may be a layer made of an organic rust-preventive agent, zinc plating, nickel plating, or the like.

If a conductor foil having an antioxidant layer is used for the first to third wiring layers $1c_1$ to $1c_3$, the antioxidant layer intervenes between the first to third wiring layers $1c_1$ to $1c_3$ and the conductive paste $1d$. For this reason, the presence of the antioxidant restrains the formation of metal cohesion $4f$.

Therefore, in order to realize the construction of the circuit substrate of this embodiment upon inhibiting the restraint of the formation of metal cohesion $4f$ by the antioxidant layer, it is preferable to manufacture the circuit substrate by a method that will be described below with reference to FIG. 8.

Figure 8:
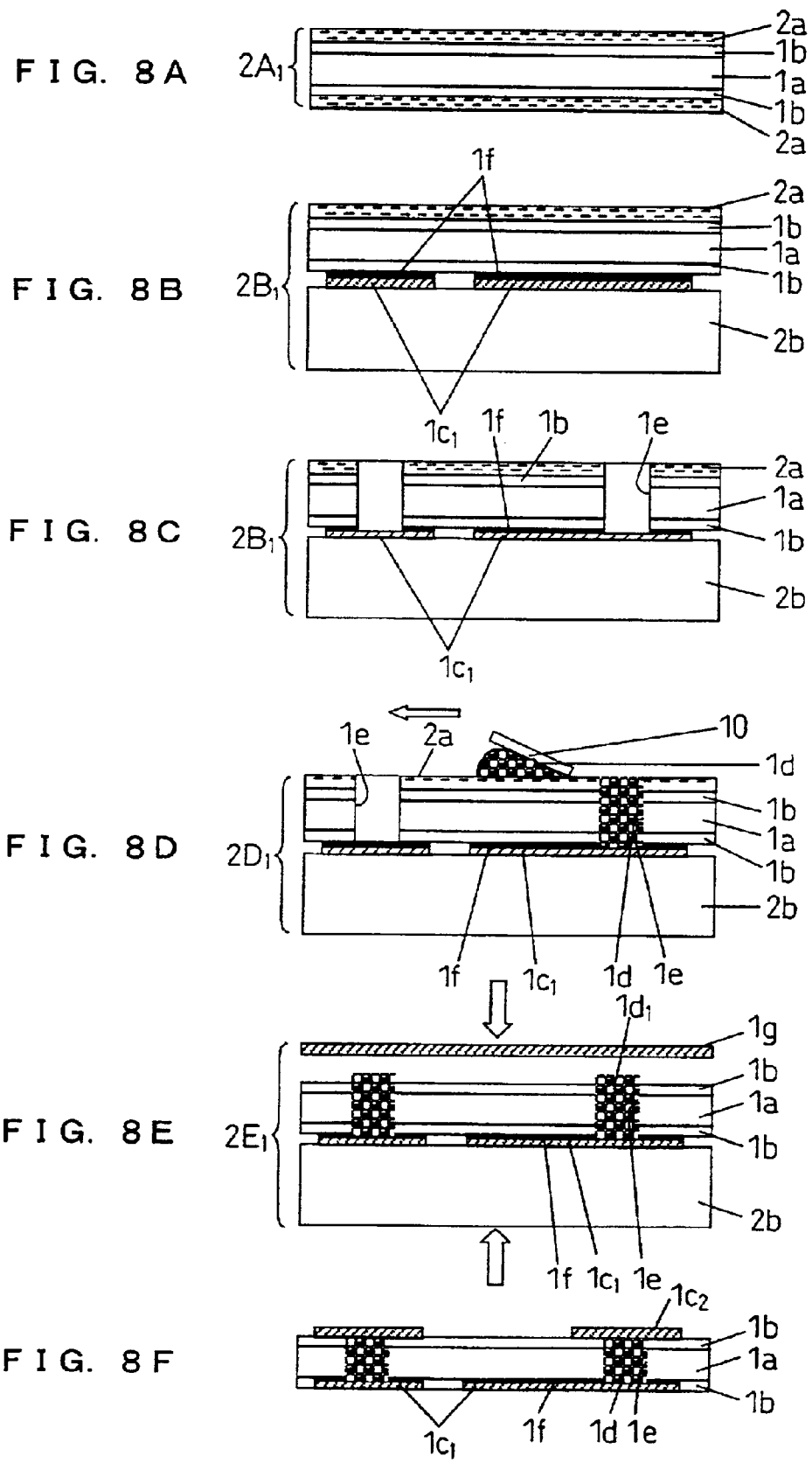
FIGS. 8A to 8F are cross-sectional views respectively showing a manufacturing method of a both-sided circuit substrate according to third embodiment of the present invention.

Here, since the manufacturing method of a circuit substrate described below is basically similar to the manufacturing method of a circuit substrate shown in FIGS. 2 and 3, like parts in FIG. 8 are denoted with like reference numerals in FIGS. 2 and 3, and the detailed description thereof will be omitted. Further, in the manufacturing method described below, an example of a manufacturing method is given in which this embodiment is applied to a both-sided circuit substrate, however, it goes without saying that this manufacturing method can likewise be applied to a manufacturing method of a multi-layer circuit substrate.

First, as shown in FIG. 8A, a releasing film $2a$ is laminated onto both surfaces of an insulating base $1a$ having a resin adhesive layer $1b$ provided on both surfaces thereof.

Next, as shown in FIG. 8B, a first wiring layer $1c_1$ is formed in advance on a first supporting base $2b$. Here, the first wiring layer $1c_1$ to be used here is one having an antioxidant layer $1f$ formed at least on a surface thereof that is exposed from the first supporting base $2b$ (the surface that abuts on the insulating base $1a$).

Next, the laminate $2A_1$ fabricated through the step of FIG. 8A is subjected to the following process. Namely, as shown in FIG. 8B, the releasing film $2a$ on one surface side of the insulating base $1a$ is released, and this insulating base $1a$ is laminated onto the first wiring layer $1c_1$ provided on the first supporting base $2b$.

Next, the laminate $2B_1$ fabricated through the step of FIG. 8B is subjected to the following process. Namely, a through hole $1e$ is formed in the laminate $2B_1$ at predetermined positions using a technique such as the laser processing method, as shown in FIG. 8C. The through hole $1e$ is formed from the remaining releasing film $2a$ side towards the insulating base $1a$ until the through hole $1e$ reaches the surface of the first wiring layer $1c_1$. Further, the through hole $1e$ is formed in alignment with the first wiring layer $1c_1$. In forming the through hole $1e$ in this manner, the antioxidant layer $1f$ exposed at the bottom of the through hole $1e$ is selectively removed simultaneously. Subsequently, as shown in FIG. 8D, the through hole $1e$ is filled with a conductive paste $1d$ with the use of a squeegee 10.

Next, as shown in FIG. 8E, the remaining releasing film $2a$ is removed from the laminate $2D_1$ fabricated through the step of FIG. 8D. In the meantime, a copper foil $1g$ is prepared in advance, or a second supporting base having a second wiring layer $1c_2$ formed thereon is prepared. Here, in the step shown in FIG. 8E, copper foil $1g$ is used. For this reason, the following description will be given assuming that the copper foil $1g$ is to be used.

First, the copper foil $1g$ is laminated and placed on the insulating base $1a$. Next, the laminate $2E_1$ fabricated through the above-mentioned step is heated while being compressed along the thickness direction of the insulating base $1a$. This integrates the laminate $2E$ and forms a metal cohesion $4f$ (not shown in FIGS. 8E and 8F) between the first wiring layer $1c_1$ and the conductive paste $1d$ and between the copper foil $1g$ and the conductive paste $1d$. This enhances the bonding strength between the first wiring layer $1c_1$ and the conductive paste $1d$ and between the copper foil $1g$ and the conductive paste $1d$. In this process, since the antioxidant layer $1f$ that was present between the first wiring layer $1c_1$ and the conductive paste $1d_1$ is removed in advance, the metal cohesion $4f$ is formed therebetween with certainty, so that the bonding strength is enhanced.

Thereafter, as shown in FIG. 8F, after the copper foil $1g$ is subjected to a patterning process so as to become the second wiring layer $1c_2$, the first supporting base $2b$ is removed from the laminate $2E_1$, thereby completing a two-sided circuit substrate $2F$.

Fourth Embodiment

Figure 9:
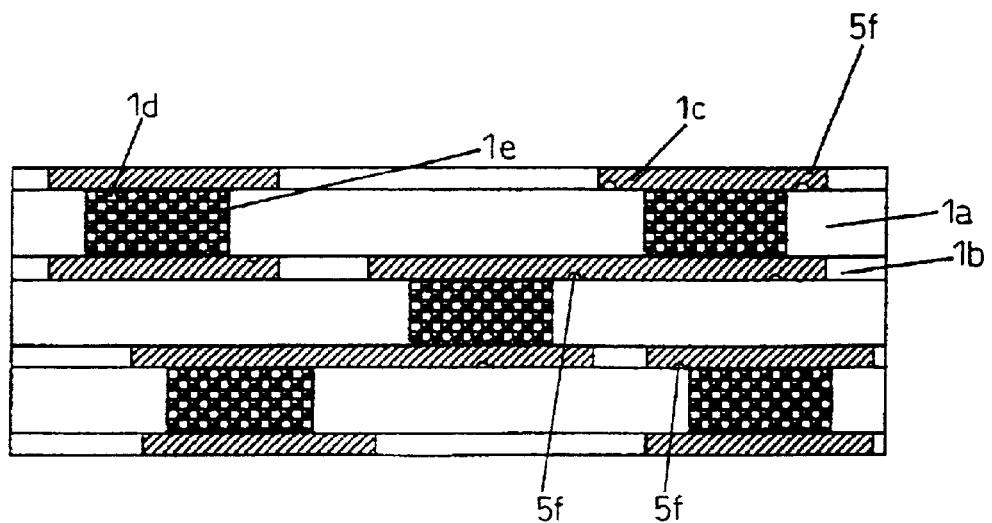
FIG. 9 is a cross-sectional view showing a multi-layer circuit substrate according to fourth embodiment of the present invention.

FIG. 9 is a cross-sectional view showing a multi-layer circuit substrate (made of four layers in FIG. 9) according to fourth embodiment of the present invention. Here, since the basic construction of this multi-layer circuit substrate is similar to the multi-layer circuit substrate described with reference to FIG. 1, the description thereof will be omitted.

This embodiment is characterized in that a region $5f$ where the wiring layer $1c$ is not in contact with the insulating base $1a$ (hereafter referred to as non-contact region) is partially formed at a place of contact between the wiring layer $1c$ and the insulating base $1a$ in a multi-layer circuit substrate.

When the non-contact region $5f$ is formed, the bonding strength at the bonding site is weakened. For this reason, the following relationship is generated when the bonding strength at the bonding site (non-contact region $5f$ is not formed) between the wiring layer $1c$ and the conductive paste $1d$ is compared with the bonding strength at the bonding site (non-contact region $5f$ is not formed) between the wiring layer $1c$ and the insulating base $1a$.

Since the bonding strength at the bonding site between the wiring layer $1c$ and the insulating base $1a$ is weakened, the connecting strength between the wiring layer $1c$ and the insulating base $1a$ is relatively weakened as compared with the bonding strength between the wiring layer $1c$ and the conductive paste $1d$.

As a result of generation of such a relative relationship of the bonding strength, the reliability of electrical connection at the via part is enhanced in this embodiment in the same manner as in the above-described first to third embodiments.

The non-contact region $5f$ can be formed, for example, in the following manner by applying the method of manufacturing a multi-layer circuit substrate described above with reference to FIGS. 2 to 6. Upon allowing the resin adhesive layer $1b$ formed on both surfaces of the insulating base $1a$ to contain a solvent or the like, optional materials and pressing condition may be set in the pressing step described with reference to FIGS. 3B and 6A so that voids may be formed between the wiring layer $1c$ and the insulating base $1a$ by evaporation of the solvent after the resin adhesive layer $1b$ is cured. Thus, the non-contact region $5f$ can be formed in the resin adhesive layer $1b$. Here, the formation of non-contact region $5f$ in such a pressing step may be carried out not only during the step of pressurizing the laminate $2E$ or laminate $2I$ described with reference to FIGS. 3B and 6A but also during the lamination of a releasing film $2a$ onto the insulating base $1a$ having a resin adhesive layer $1b$ disposed thereon, as shown in FIG. 2A.

Fifth Embodiment

Figure 10:
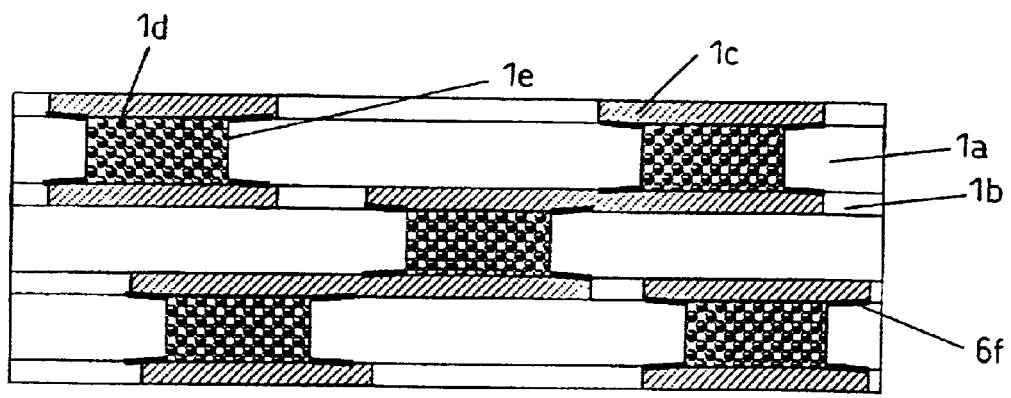
FIG. 10 is a cross-sectional view showing a multi-layer circuit substrate according to fifth embodiment of the present invention.

FIG. 10 is a cross-sectional view showing a multi-layer circuit substrate (made of four layers in FIG. 10) according to fifth embodiment of the present invention. Here, since the basic construction of this multi-layer circuit substrate is similar to the multi-layer circuit substrate described with reference to FIG. 1, the description thereof will be omitted.

This embodiment is characterized in that a region $6f$ with residual resin solution containing an uncured liquid resin component is formed between the wiring layer $1c$ and the insulating base $1a$ at the place of contact between the wiring layer $1c$ and the insulating base $1a$ by using a conductive paste $1d'$ specific to this embodiment as the conductive paste.

When the region $6f$ with residual resin solution is formed, the bonding strength at the bonding site is weakened. For this reason, the following relationship is generated when the bonding strength at the bonding site (region $6f$ with residual resin solution is not formed) between the wiring layer $1c$ and the conductive paste $1d'$ is compared with the bonding strength at the bonding site (region $6f$ with residual resin solution is not formed) between the wiring layer $1c$ and the insulating base $1a$.

Since the bonding strength at the bonding site between the wiring layer $1c$ and the insulating base $1a$ is weakened, the connecting strength between the wiring layer $1c$ and the insulating base $1a$ is relatively weakened as compared with the bonding strength between the wiring layer $1c$ and the conductive paste $1d'$.

As a result of generation of such a relative relationship of the bonding strength, the reliability of electrical connection at the via part is enhanced in this embodiment in the same manner as in the above-described first and second embodiments.

A multi-layer circuit substrate having such a region $6f$ with residual resin solution can be formed, for example, by applying the manufacturing method of a multi-layer circuit substrate described above with reference to FIGS. 2 to 6. The characteristic features in this manufacturing method of a multi-layer circuit substrate are as follows.

As the conductive paste $1d'$, a conductive paste containing an optional conductive powder and a liquid epoxy resin and further containing a powdery curing agent as a curing agent is used. Here, at the beginning of the pressing step described with reference to FIGS. 3B and 6A (the curing of the conductive paste $1d'$ has not proceeded yet), minute void holes are generally generated between the wiring layer $1a$ and the conductive paste $1d'$ due to minute irregularity on the surface of the wiring layer $1c$.

When the curing of the conductive paste $1d'$ proceeds in the state in which such gaps have been formed, the liquid epoxy resin constituting the conductive paste $1d'$ flows onto the resin adhesive layer $1b$ on the insulating base $1a$ via the above-mentioned gaps. However, since a powdery curing agent is used as the curing agent, the curing agent does not flow onto the resin adhesive layer $1b$ via the void holes. For this reason, the epoxy resin component that has flowed in remains uncured in the resin adhesive layer $1b$, whereby a region $6f$ with residual resin solution is formed.

Next, a specific method of manufacturing a circuit substrate according to this embodiment will be described with reference to FIGS. 11 and 12. First, the first production method will be described with reference to FIG. 11.

Here, since the manufacturing method of a circuit substrate described below is basically similar to the manufacturing method of a circuit substrate shown in FIGS. 2 and 3, like parts in FIG. 11 are denoted with like reference numerals in FIGS. 2 and 3, and the detailed description thereof will be omitted. Further, in the manufacturing method described below, an example of a manufacturing method is given in which this embodiment is applied to a both-sided circuit substrate, however, it goes without saying that this manufacturing method can likewise be applied to a manufacturing method of a multi-layer circuit substrate.

First, as shown in FIG. 11A, a releasing film $2a$ is laminated onto both surfaces of an insulating base $1a$ having a resin adhesive layer $1b$ provided on both surfaces thereof.

Next, as shown in FIG. 11B, a first wiring layer $1c_1$ is formed on a first supporting base $2b$ in advance. Upon this, the following process is carried out on the laminate $2A_2$ fabricated through the step of FIG. 11A. Namely, the releasing film $2a$ on one surface side of the insulating base $1a$ is released, and this insulating base $1a$ is laminated onto the first wiring layer $1c_1$ provided on the first supporting base $2b$.

Next, in the laminate $2B_2$, a through hole $1e$ is formed at predetermined positions using a technique such as the laser processing method, as shown in FIG. 11C. The through hole $1e$ is formed from the remaining releasing film $2a$ side towards the insulating base $1a$ until the through hole $1e$ reaches the surface of the first wiring layer $1c_1$. Further, the through hole $1e$ is formed in alignment with the first wiring layer $1c_1$.

Subsequently, as shown in FIG. 11D, the through hole $1e$ is filled with a conductive paste $1d'$ with the use of a squeegee 10. As the conductive paste $1d'$, a conductive paste containing an optional arbitrary conductive powder and a liquid epoxy resin and further containing a powdery curing agent as a curing agent is used.

Next, as shown in FIG. 11E, the remaining releasing film $2a$ is removed from the laminate $2D_2$ fabricated through the step of FIG. 11D. In the meantime, a copper foil $1g$ is prepared in advance, or a second supporting base having a second wiring layer $1c_2$ formed thereon is prepared. Here, in the step shown in FIG. 11E, copper foil $1g$ is used. For this reason, the following description will be given assuming that the copper foil $1g$ is to be used.

First, the copper foil $1g$ is laminated and placed on the insulating base $1a$. Next, the laminate $2E_2$ fabricated through the above-described step is heated while being compressed along the thickness direction of the insulating base $1a$. This integrates the laminate $2E_2$ and forms a bond between the first wiring layer $1c_1$ and the conductive paste $1d'$ and between the copper foil $1g$ and the conductive paste $1d'$ for establishing electrical connection. Here, in this process, a metal cohesion $4f$ may be formed between the first wiring layer $1c_1$ and the conductive paste $1d'$ and between the copper foil $1g$ and the conductive paste $1d'$. Then, the bonding strength therebetween can be enhanced.

When the curing of the conductive paste $1d'$ proceeds, the following occurs. Namely, minute void holes are generated between the first wiring layer $1c_1$ and the conductive paste $1d'$ and between the copper foil $1g$ and the conductive paste $1d'$ due to minute irregularity or the like on the surface of the wiring layer $1c_1$ and on the copper foil $1g$. When the curing of the conductive paste $1d'$ proceeds in the state in which such gaps have been formed, the liquid epoxy resin constituting the conductive paste $1d'$ flows onto the resin adhesive layer $1b$ on the insulating base $1a$ via the above-mentioned gaps. However, since a powdery curing agent is used as the curing agent, the curing agent does not flow onto the resin adhesive layer $1b$ via the void holes. For this reason, the epoxy resin component that has flowed in remains uncured in the resin adhesive layer $1b$, whereby a region $5f$ with residual resin solution is formed at the interface between the insulating base $1a$ and the first wiring layer $1c_1$ and at the interface between the insulating base $1a$ and the copper foil $1g$ in an adjacency of the conductive paste $1d'$.

Here, the region $5f$ with residual resin solution is formed to some extent on the first wiring layer $1c_1$ in the step of filling the through hole $1e$ with the conductive paste $1d'$ shown in FIG. 11D.

Thereafter, as shown in FIG. 8F, after the copper foil $1g$ is subjected to a patterning process to become a second wiring layer $1c_2$, the first supporting base $2b$ is removed from the laminate $2E$ to complete the both-sided circuit substrate $2F$.

Next, the second manufacturing method of this embodiment will be described.

Figure 12A:
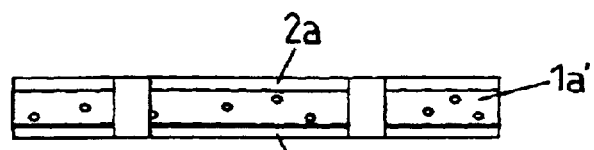
FIGS. 12A to 12G are cross-sectional views respectively showing a second manufacturing method of a both-sided circuit substrate according to fifth embodiment of the present invention.

First, as shown in FIG. 12A, a prepreg base $1a'$ is prepared which is an example of a compressible insulating base. A releasing film $2a$ is laminated onto both surfaces of this prepreg base $1a'$.

Figure 12B:
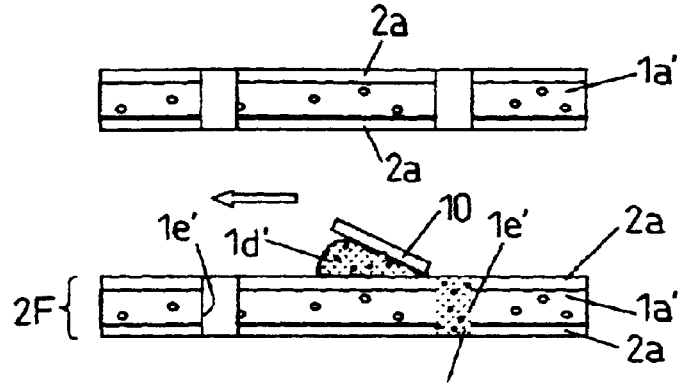

Next, in the prepreg base $1a'$, a through hole $1e'$ is formed at predetermined positions using a technique such as the laser processing method, as shown in FIG. 12B. Subsequently, the through hole $1e'$ is filled with a conductive paste $1d'$ with the use of a squeegee 10. As the conductive paste $1d'$, a conductive paste containing an optional conductive powder and a liquid epoxy resin and further containing a powdery curing agent as a curing agent is used.

Figure 12C:
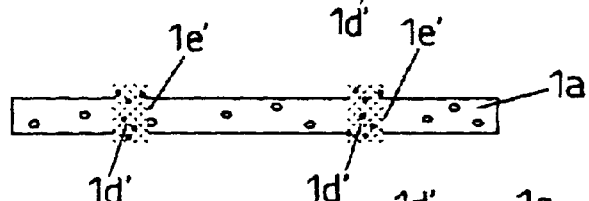

Next, as shown in FIG. 12C, the releasing film $2a$ is released and removed from both surfaces of the prepreg base $1a'$.

Figure 12D:
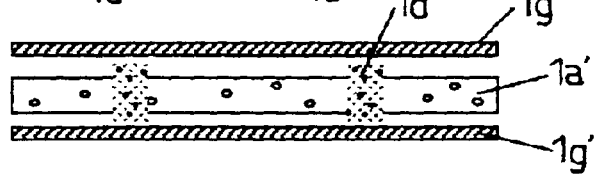

Next, as shown in FIG. 12D, a copper foil $1g$ (and $1g'$) is laminated and placed on both surfaces of the prepreg base $1a'$. Then, the prepreg base $1a'$ and the copper foil $1g$ (and $1g'$) are heated while being compressed along the thickness direction of the prepreg base $1a'$. This integrates the prepreg base $1a'$ with the copper foil $1g$ (and $1g'$), and forms a bond between the copper foil $1g$ (and $1g'$) and the conductive paste $1d'$ to establish an electrical connection.

When the curing of the conductive paste $1d'$ proceeds, a region $5F$ with residual resin solution is formed at the interface between the prepreg base $1a'$ and the copper foil $1g$ in an adjacency of the conductive paste $1d'$. The reason why the region $5f$ with residual resin solution is formed is as described in the first manufacturing method of this embodiment or the like.

Figure 12E:
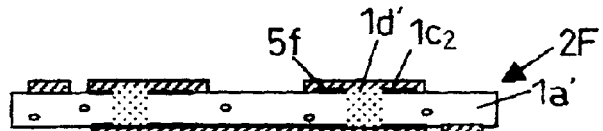

Thereafter, as shown in FIG. 12E, the copper foil $1g$ is subjected to a patterning process to become first and second wiring layers $1c_1$, $1c_2$ to complete the both-sided circuit substrate $2F$.

Figure 12F:
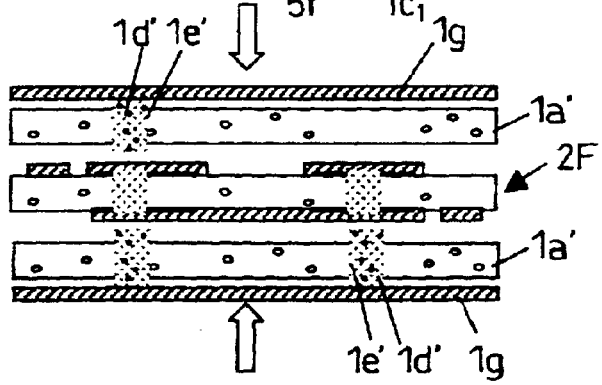

If a multi-layer circuit substrate is to be formed using a both-sided circuit substrate 2F, a prepreg substrate 1a' is successively formed further on both surfaces of the both-sided circuit substrate 2F, as shown in FIG. 12F, and then a through hole 1e' is formed through these prepreg substrates 1a'. The through hole 1e' is formed in alignment with a position at which the first and second wiring layers $1c_1$, $1c_2$ are formed. Subsequently, the through hole 1e' is filled with a conductive paste 1d'.

Next, a copper foil 1g is prepared in advance, or third and fourth supporting bases having third and fourth wiring layers $1c_3$, $1c_4$ formed thereon are prepared. Here, in the step shown in FIG. 12F, copper foil 1g is used. For this reason, the following description will be given assuming that the copper foil 1g is to be used.

Next, the prepared copper foil 1g is laminated and placed on each prepreg base 1a' laminated on both surfaces of the both-sided circuit substrate 2F. Next, the both-sided circuit substrate 2F, the prepreg base 1a', and the copper foil 1g are integrated by being heated while being compressed along the thickness direction of the prepreg base 1a'. During the process, a region 5F with residual resin solution is formed at the interface between the prepreg base 1a' and the copper foil 1g in an adjacency of the conductive paste 1d'.

Figure 12G:
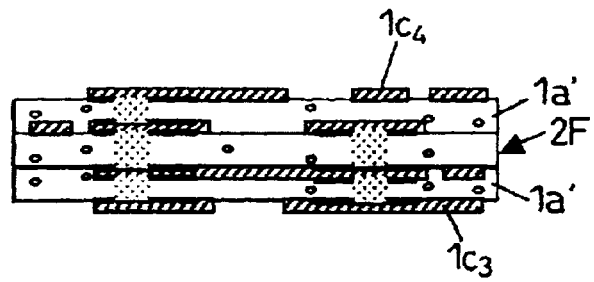

Thereafter, as shown in FIG. 12G, the copper foils 1g, 1g are subjected to a patterning process to become third and fourth wiring layers $1c_3$, $1c_4$ to complete the multi-layer circuit substrate.

Sixth Embodiment

Figure 13:
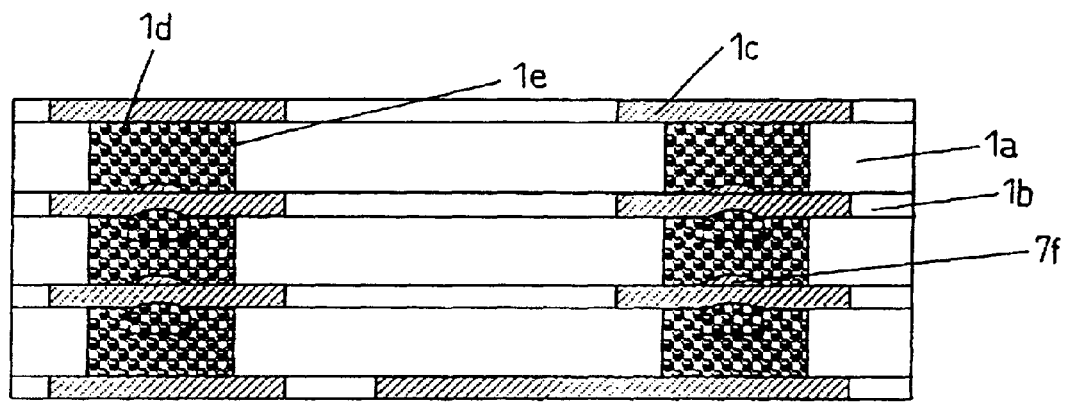
FIG. 13 is a cross-sectional view showing a multi-layer circuit substrate according to sixth embodiment of the present invention.

FIG. 13 is a cross-sectional view showing a multi-layer circuit substrate (made of four layers in FIG. 13) according to sixth embodiment of the present invention. Here, since the basic construction of this multi-layer circuit substrate is similar to the multi-layer circuit substrate described with reference to FIG. 1, the description thereof will be omitted.

This embodiment is characterized in that, in the multi-layer circuit substrate, the wiring layer 1c and the conductive paste 1d have a part 7f (hereafter referred to as irregularity region) that protrudes to the inside and outside along the thickness direction of the insulating base 1a in a region of contact between the wiring layer 1c and the conductive paste 1d.

When an irregularity region 7f is formed, an anchoring effect is produced by biting of the conductive paste 1d into the wiring layer 1c at the bonding site thereof, and further the metal cohesion described in third embodiment is promoted, so that the bonding strength thereof is enhanced. For this reason, the following relationship is generated when the bonding strength at the bonding site (where the irregularity region 7f is formed) between the wiring layer 1c and the conductive paste 1d is compared with the bonding strength at the bonding site (where the irregularity region 7f is not formed) between the wiring layer 1c and the insulating base 1a.

Since the bonding strength at the bonding site between the wiring layer 1c and the conductive paste 1d is enhanced, the connecting strength between the wiring layer 1c and the insulating base 1a becomes relatively weaker than the bonding strength between the wiring layer 1c and the conductive paste 1d.

As a result of the generation of such a relative relationship of the bonding strength, the reliability of electrical connection at the via part is enhanced in this embodiment in the same manner as in the above-described first and second embodiments.

A multi-layer circuit substrate having such an irregularity region 7f can be produced, for example, in the following manner by applying the manufacturing method of a multi-layer circuit substrate described above with reference to FIGS. 2 to 6.

First, with the use of materials similar to those mentioned as examples in first embodiment, a both-sided circuit substrate is fabricated by the manufacturing method of FIGS. 2 and 3. Then, in the fabricated both-sided circuit substrate, the compression ratio in an adjacency of the via hole increases at the time of pressing. For this reason, the conductor foil (copper foil or the like) constituting the wiring layer 1c is elevated at the place of contact between the conductive paste 1d and the wiring layer 1c, thereby forming an irregularity region 7f.

With the use of the both-sided circuit substrate (having an irregularity region 7f) formed in this manner, a multi-layer circuit substrate is fabricated by the manufacturing method of FIGS. 4 to 6. In the process, the both layers (both-sided circuit substrate and insulating base) are aligned with each other so that the irregularity region 7f already formed may be brought into contact with the conductive paste 1d of another insulating base 1a to be laminated. This forms the multi-layer circuit substrate shown in FIG. 13.

Seventh Embodiment

Since the basic construction of the multi-layer circuit substrate in this embodiment is similar to the multi-layer circuit substrate described with reference to FIG. 1, the description thereof will be omitted.

This embodiment is characterized in that, in the multi-layer circuit substrate shown in FIG. 1, the bonding strength between the conductive paste 1d and the insulating base 1a on the wall surface of the through hole 1e is set as follows.

The tensile strength of the conductive paste 1d in the thickness direction of the base is compared with the bonding strength between the conductive paste 1d and the insulating base 1a on the wall surface of the through hole 1e, and the latter (bonding strength between the conductive paste 1d and the insulating base 1a) is made relatively lower than the former.

As a result of the generation of such a relative relationship between the tensile strength and the bonding strength, the reliability of electrical connection at the via part is enhanced in this embodiment in the same manner as in the above-described first and second embodiments.

Hereafter, the reasons thereof will be described. By establishing the relative relationship between the tensile strength and the bonding strength in the above-mentioned manner, the following occurs. When a stress caused by the difference of thermal expansion between the insulating base 1a and the conductive paste 1d is generated, first the stress causes the interface between the conductive paste 1d and the insulating base 1a on the wall surface of the through hole 1e to serve as a stress-alleviating part. For this reason, the stress is absorbed by such a stress-alleviating action caused by the stress-alleviating part, and hence is less likely to affect the bonding site between the wiring layer 1c and the conductive paste 1d. This enhances the connecting strength at the bonding site between the wiring layer 1c and the conductive paste 1d, so that the circuit substrate can have a high connection reliability even under a temperature cycle close to the normal state of use.

Such a multi-layer circuit substrate can be manufactured, for example, in the following manner by applying the method of producing a multi-layer circuit substrate described above with reference to FIGS. 2 to 6.

After a through hole 1e is formed in an insulating base 1a as shown in FIGS. 2C and 4C, the wall surface of the through hole 1e is subjected to a mirror polishing treatment to weaken the bonding strength between the conductive paste 1d and the insulating base 1a on the wall surface of the through hole 1e, whereby the aforesaid relative relationship between the tensile strength and the bonding strength is formed.

Instead of this, the above-mentioned relative relationship between the tensile strength and the bonding strength can be formed by applying a nonconductive substance such as resin onto the wall surface of the through hole 1e after the through hole 1e is formed.

In the above-described first to seventh embodiments, both-sided circuit substrates and multi-layer circuit substrates made of four layers have been given as examples thereof, however, the present invention is not limited to such circuit substrates alone, and it goes without saying that the present invention can be applied to other kinds of multi-layer circuit substrates having different number of layers.

Further, the manufacturing method is not limited to the above-described ones shown in FIGS. 2 to 6 alone, so that for example a method such as described in the prior art section can be used as well.

Furthermore, in the above-described first to seventh embodiments, the conductive paste 1d has been given as an example of the conductor in IVH, however, the conductor of the present invention is not limited to such a conductive paste alone, so that an IVH connecting agent of a type that obtains electrical conduction by pressing, for example, a via post made of a metal such as gold, silver, copper, nickel, palladium, lead, tin, indium, or bismuth, can be used without any particular limitation.

Thus, in the circuit substrate of each embodiment, by alleviating the stress at the non-contact site between the wiring layer and the conductor in IVH, a circuit substrate ensuring a high connection reliability even under a temperature cycle can be provided.

While the invention has been described in detail with regard to the most preferable embodiments thereof, the combination and arrangement of the components for the preferable embodiments can be changed in various ways without departing from the spirit and scope of the invention that is to be claimed later.

What is claimed is:

1. A circuit substrate comprising:
   an insulating base;
   wiring layers disposed on said insulating base;
   a conductor disposed in said insulating base to electrically connect between said wiring layers in an interlayer of said insulating base; and
   a region containing an uncured resin component provided at a bonding site between said wiring layers and said insulating base adjacent said conductor,
   wherein a bonding strength between said wiring layers and said conductor is greater than a bonding strength between said wiring layers and said insulating base, and
   wherein said conductor contains a resin composition, and a glass transition temperature of the resin composition is set lower than a glass transition temperature of a resin composition contained in said insulating base.

2. The circuit substrate according to claim 1, wherein said insulating base and said conductor contain a thermosetting epoxy resin composition, and a volume content of the thermosetting epoxy resin in said conductor is set larger than a volume content of the thermosetting epoxy resin in said insulating base.

3. The circuit substrate according to claim 1, wherein the bonding strength between said wiring layers and said conductor is greater than the bonding strength between said wiring layers and said insulating base in an area of the wiring layer adjacent said conductor.

4. The circuit substrate according to claim 1, wherein a metal cohesion is applied between said conductor and said wiring layers.

5. The circuit substrate according to claim 1, wherein a non-bonding region is provided between said wiring layers and said insulating base adjacent said conductor.

6. The circuit substrate according to claim 1, wherein a surface irregularity is formed at a bonding site between said conductor and said wiring layers.

7. A circuit substrate comprising:
   an insulating base;
   a conductor provided in said insulating base to electrically connect an interlayer of said insulating base; and
   a region containing an uncured resin component provided at a bonding site between wiring layers and said insulating base adjacent said conductor,
   wherein a tensile strength of said conductor is greater than a bonding strength between said conductor and said insulating base on a wall surface of said conductor, and
   wherein said conductor contains a resin composition, and a glass transition temperature of the resin composition is set lower than a glass transition temperature of a resin composition contained in said insulating base.

8. The circuit substrate according to claim 1, wherein said region has a conductor and an uncured resin included in the conductor.

9. A circuit substrate comprising:
   an insulating base;
   wiring layers disposed on said insulating base; and
   a conductor disposed in said insulating base to electrically connect between said wiring layers in an interlayer of said insulating base,
   wherein a bonding strength between said wiring layers and said conductor is relatively greater than a bonding strength between said wiring layers and said insulating base, and
   wherein said conductor contains a resin composition, and a glass transition temperature of the resin composition is set lower than a glass transition temperature of a resin composition contained in said insulating base.

10. A circuit substrate comprising:
    an insulating base; and
    a conductor disposed in said insulating base to electrically connect an interlayer of said insulating base,
    wherein a tensile strength of said conductor in a base thickness direction is relatively greater than a bonding strength between said conductor and said insulating base on a wall surface of said conductor, and
    wherein said conductor contains a resin composition, and a glass transition temperature of the resin composition is set lower than a glass transition temperature of a resin composition contained in said insulating base.

* * * * *